(12) United States Patent
Ebigase et al.

(10) Patent No.: US 12,249,547 B2
(45) Date of Patent: Mar. 11, 2025

(54) BONDED SUBSTRATE AND BONDED SUBSTRATE MANUFACTURING METHOD

(71) Applicant: NGK INSULATORS, LTD., Nagoya (JP)

(72) Inventors: Takashi Ebigase, Nagoya (JP); Izumi Masuda, Kitanagoya (JP); Takeshi Kaku, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 477 days.

(21) Appl. No.: 17/752,937

(22) Filed: May 25, 2022

(65) Prior Publication Data

US 2022/0285238 A1 Sep. 8, 2022

Related U.S. Application Data

(63) Continuation of application No. PCT/JP2020/045073, filed on Dec. 3, 2020.

(30) Foreign Application Priority Data

Dec. 3, 2019 (WO) .................. PCT/JP2019/047117

(51) Int. Cl.
*H01L 23/15* (2006.01)
*C04B 35/584* (2006.01)
(Continued)

(52) U.S. Cl.
CPC ............ *H01L 23/15* (2013.01); *C04B 35/584* (2013.01); *H01L 23/3735* (2013.01); *H05K 1/0306* (2013.01)

(58) Field of Classification Search
CPC ... H01L 23/15; H01L 23/3735; H05K 1/0306; C04B 35/584
(Continued)

(56) References Cited

U.S. PATENT DOCUMENTS 5,998,000 A 12/1999 Kazuo et al.
10,818,585 B2 * 10/2020 Terasaki .............. H01L 21/4857
(Continued)

FOREIGN PATENT DOCUMENTS

EP 4197990 A1 6/2023
JP 2002-201076 A 7/2002
(Continued)

OTHER PUBLICATIONS

International Search Report of PCT/JP2020/045073 dated Feb. 9, 2021.
(Continued)

*Primary Examiner* — Jasmine J Clark
(74) *Attorney, Agent, or Firm* — MATTINGLY & MALUR, PC

(57) ABSTRACT

The bonded substrate includes the silicon nitride ceramic substrate, a copper plate, the bonding layer, and penetrating regions. The copper plate and the bonding layer are patterned into a predetermined shape, and are disposed over a main surface of the silicon nitride ceramic substrate. The bonding layer bonds the copper plate to the main surface of the silicon nitride ceramic substrate. The penetrating regions each include one or more penetrating portions penetrating continuously from the main surface of the substrate into the silicon nitride ceramic substrate to a depth of 3 μm or more and 20 μm or less, and contain silver, and the number of penetrating regions present per square millimeter of the main surface of the substrate is one or more and 30 or less.

20 Claims, 11 Drawing Sheets

(51) Int. Cl.
 *H01L 23/373* (2006.01)
 *H05K 1/03* (2006.01)
(58) Field of Classification Search
 USPC .......................................................... 257/702
 See application file for complete search history.

(56) References Cited

U.S. PATENT DOCUMENTS

| | | | |
|---|---|---|---|
| 10,861,769 | B2 | 12/2020 | Iwasaki et al. |
| 11,948,900 | B2 * | 4/2024 | Yonetsu ................ C04B 37/028 |
| 2016/0152004 | A1 | 6/2016 | Niino |
| 2016/0192503 | A1 | 6/2016 | Chiwata |
| 2017/0323842 | A1 | 11/2017 | Tani et al. |
| 2019/0150298 | A1 | 5/2019 | Kishimoto |
| 2019/0371690 | A1 | 12/2019 | Iwasaki et al. |
| 2020/0006213 | A1 * | 1/2020 | Terasaki ................ C04B 37/023 |
| 2020/0128664 | A1 | 4/2020 | Harada et al. |
| 2021/0176860 | A1 | 6/2021 | Tsugawa et al. |

FOREIGN PATENT DOCUMENTS

| | | | |
|---|---|---|---|
| JP | 2010-076948 | A | 4/2010 |
| JP | 2015-164184 | A | 9/2015 |
| JP | 6295382 | B1 | 3/2018 |
| JP | 2018-140929 | A | 9/2018 |
| JP | 2018-160706 | A | 10/2018 |
| JP | 2019-104680 | A | 6/2019 |
| WO | 2013/008920 | A1 | 1/2013 |
| WO | 2014/175459 | A1 | 10/2014 |
| WO | 2015/029478 | A1 | 3/2015 |
| WO | 2017/213207 | A1 | 12/2017 |
| WO | 2018/199060 | A1 | 11/2018 |
| WO | 2018/221493 | A1 | 12/2018 |

OTHER PUBLICATIONS

International Search Report of PCT/JP2019/047117 dated Feb. 25, 2020.
Unexamined U.S. Appl. No. 17/752,935, filed May 25, 2022.
International Preliminary Report on Patentability received in corresponding International Application No. PCT/JP2019/047117 dated Jun. 16, 2022.
Extended European Search Report received in corresponding European Application No. 20895410.7 dated Dec. 5, 2023.

* cited by examiner

F I G. 3
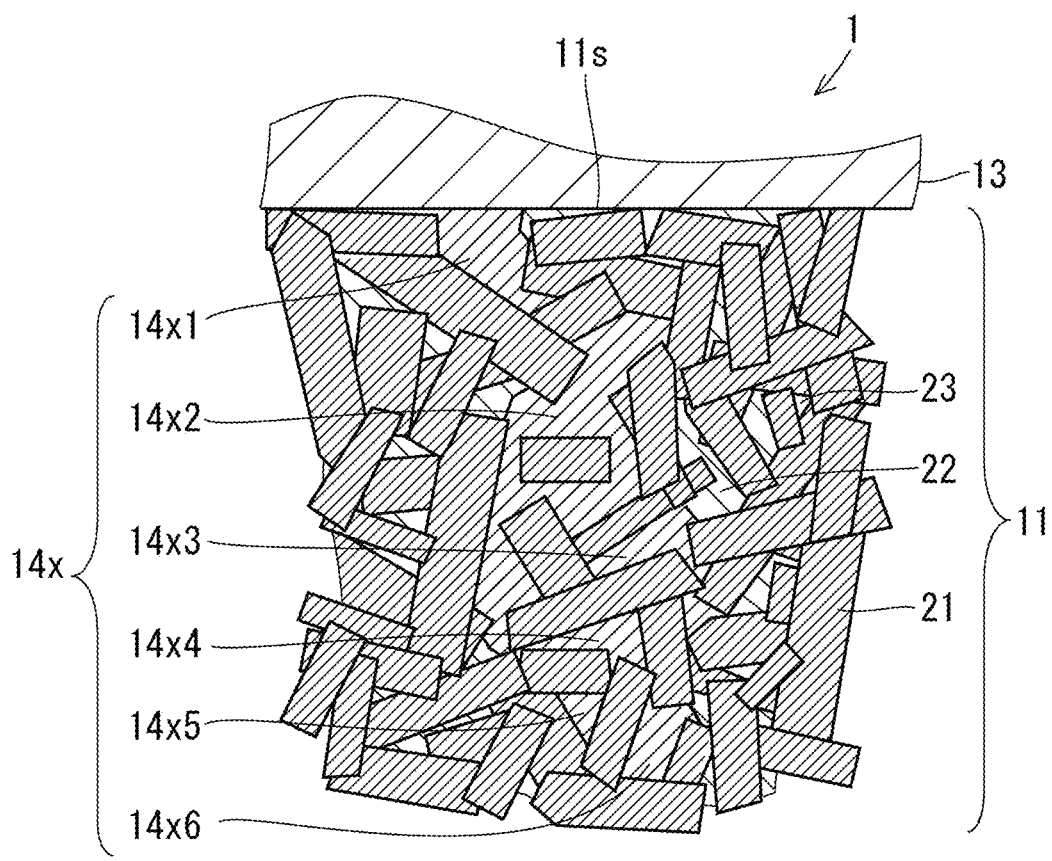

F I G. 4
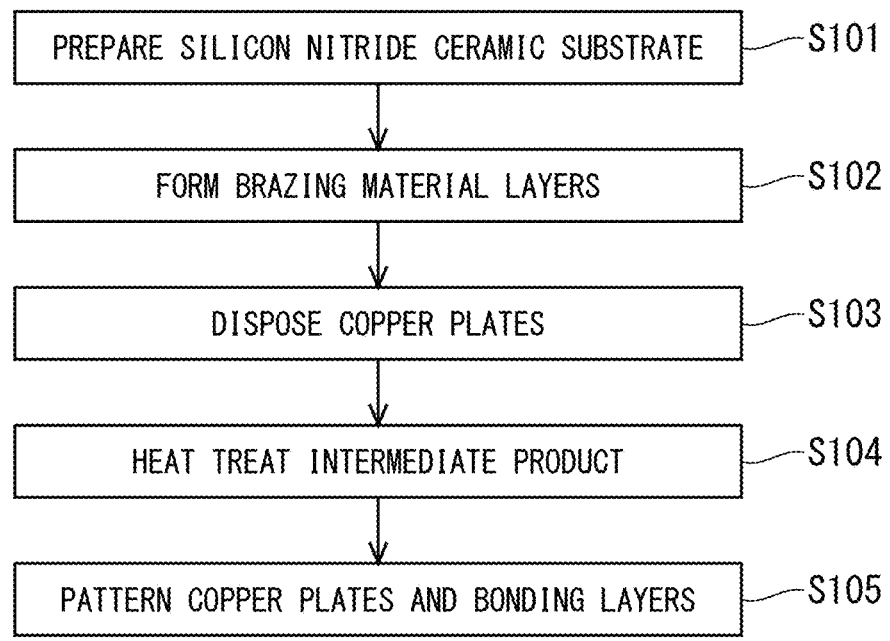

F I G. 8
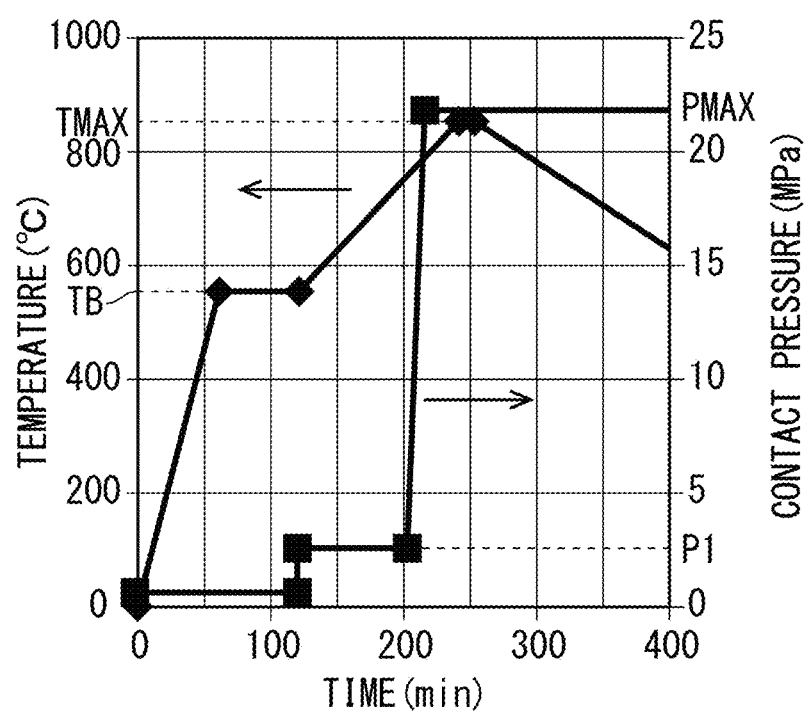

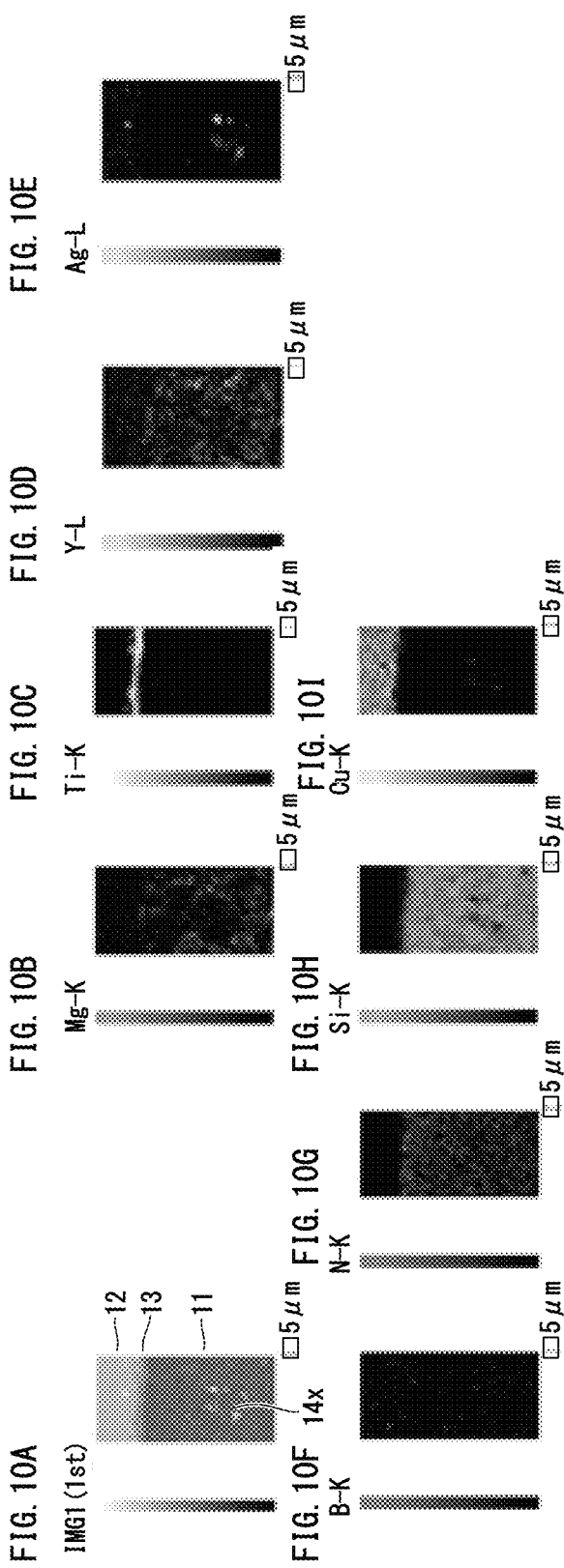

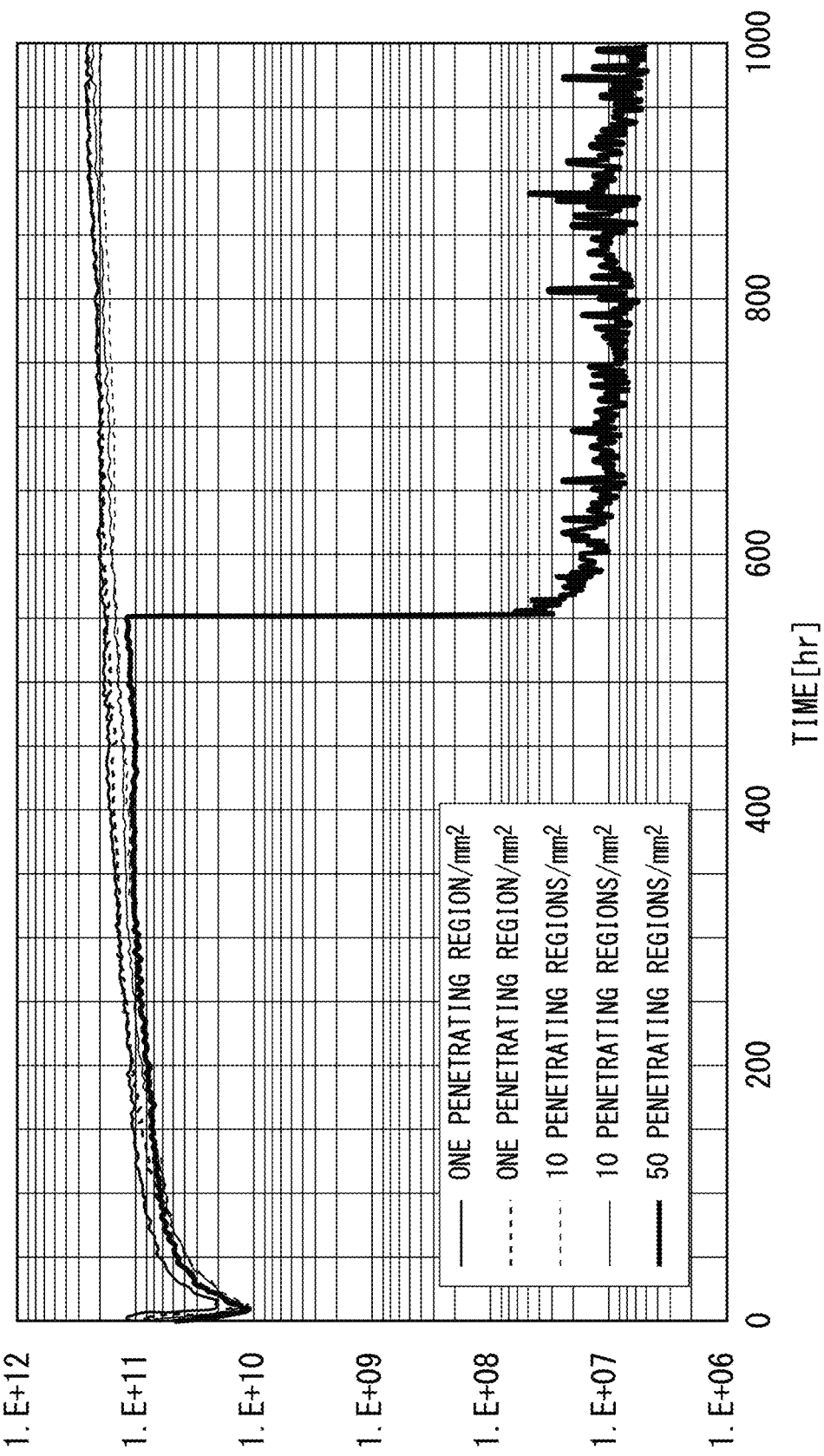

BONDED SUBSTRATE AND BONDED SUBSTRATE MANUFACTURING METHOD

CROSS-REFERENCE TO RELATED APPLICATION

This application is a continuation application of PCT/JP2020/045073, filed on Dec. 3, 2020, which claims the benefit of priority of Japanese Patent Application No. PCT/JP2019/047117, filed on Dec. 3, 2019, the entire contents of which is incorporated herein by reference.

BACKGROUND OF THE INVENTION

Field of the Invention

The present invention relates to bonded substrates and bonded substrate manufacturing methods.

Description of the Background Art

Silicon nitride ceramics are highly heat conductive and highly insulating. A bonded substrate in which a copper plate is bonded to a silicon nitride ceramic substrate through a bonding layer is thus suitable for use as an insulating heat-dissipating substrate on which a power semiconductor device is mounted.

The bonded substrate is manufactured by manufacturing an intermediate product including a brazing material layer between the copper plate and the silicon nitride ceramic substrate, and heat treating the manufactured intermediate product to generate the bonding layer between the copper plate and the silicon nitride ceramic substrate in many cases.

The brazing material layer contains a powder of titanium hydride and a powder containing silver and copper in many cases. The bonding layer contains, as a major component, a titanium nitride being a product of reaction of titanium derived from the powder of titanium hydride and nitrogen derived from the silicon nitride ceramic substrate in many cases.

For example, in technology disclosed in Japanese Patent Application Laid-Open No. 2002-201076, a metal plate of copper is bonded to a silicon nitride substrate by brazing. As a brazing material, an Ag—Cu alloy containing active metal, such as Ti, Zr, and Hf, is used (paragraph 0016). In the technology disclosed in Japanese Patent Application Laid-Open No. 2002-201076, TiN particles are sufficiently deposited at an interface between a brazing material layer and silicon nitride to obtain a high bonding strength.

Japanese Patent Application Laid-Open No. 2015-164184 discloses technology of obtaining both of a high bonding strength and a high dielectric strength by setting the number of white spots (voids at grain boundaries) per square millimeter of a main surface to 50 to 200, which solves a problem that, in a case where a metal plate is bonded to a ceramic substrate having few white spots on the surface thereof, an anchoring effect is poor, and, as a result, a bonding strength is poor due to a small quantity of metal components entering the white spots.

In this case, however, ion migration is likely to occur in the bonded substrate when a voltage is applied to patterned potions of the metal plate.

With conventional technology, an adhesion strength of the bonding layer to the silicon nitride ceramic substrate sometimes cannot sufficiently be improved, and, as a result, a bonded substrate having high cold durability sometimes cannot be obtained.

SUMMARY

The present invention is directed to a bonded substrate.

The bonded substrate includes a silicon nitride ceramic substrate, a copper plate, a bonding layer, and penetrating regions. The copper plate and the bonding layer are patterned into a predetermined shape, and are disposed over a main surface of the silicon nitride ceramic substrate. The bonding layer bonds the copper plate to the main surface of the silicon nitride ceramic substrate. The penetrating regions each include one or more penetrating portions penetrating continuously from the main surface of the silicon nitride ceramic substrate into the silicon nitride ceramic substrate to a depth of 3 μm or more and 20 μm or less, and the number of penetrating regions present per square millimeter of the main surface of the silicon nitride ceramic substrate is one or more and 30 or less.

The present invention is also directed to a bonded substrate manufacturing method.

In the bonded substrate manufacturing method, a silicon nitride ceramic substrate is prepared. A brazing material layer is formed on a main surface of the silicon nitride ceramic substrate. A copper plate is disposed on the brazing material layer. An intermediate product including the silicon nitride ceramic substrate, the brazing material layer, and the copper plate is thereby obtained. The intermediate product is heat treated to generate a bonding layer bonding the copper plate to the main surface of the silicon nitride ceramic substrate, and a plurality of penetrating regions each including one or more penetrating portions penetrating continuously from the bonding layer into the silicon nitride substrate to a depth of 3 μm or more and 20 μm or less from the main surface. The penetrating regions contain silver, and are formed so that the number of penetrating regions present per square millimeter of the main surface of the silicon nitride ceramic substrate is one or more and 30 or less. The copper plate and the bonding layer are patterned into a predetermined shape after heat treatment.

According to the present invention, the penetrating regions containing silver interfere with separation of the bonding layer from the silicon nitride ceramic substrate. An adhesion strength of the bonding layer to the silicon nitride ceramic substrate is thus improved. On the other hand, reduction in insulation resistance due to migration of silver between patterns is suppressed. A bonded substrate which has high cold durability and in which insulation resistance between patterns is secured can thereby be obtained.

It is therefore an object of present invention to improve an adhesion strength of a bonding layer to a silicon nitride ceramic substrate, and obtain a bonded substrate having high cold durability.

BRIEF DESCRIPTION OF DRAWINGS

FIG. 3 is a schematic cross-sectional view showing a penetrating portion 14x in the silicon nitride ceramic substrate 11 and the vicinity of the penetrating portion 14x in more details.

FIG. 4 is a flowchart showing a sequence in manufacturing the bonded substrate 1.

FIG. 8 shows a second example of a temperature profile and a contact pressure profile when hot pressing is performed in the process of manufacturing the bonded substrate 1.

FIGS. 10A to 10I show a cross-sectional SEM image and elemental mapping images of a bonded substrate 1.

FIG. 11 is a graph showing temporal changes of insulation resistance of some bonded substrates 1 when a migration test is conducted.

DESCRIPTION OF EMBODIMENTS

1 Bonded Substrate

Figure 1:
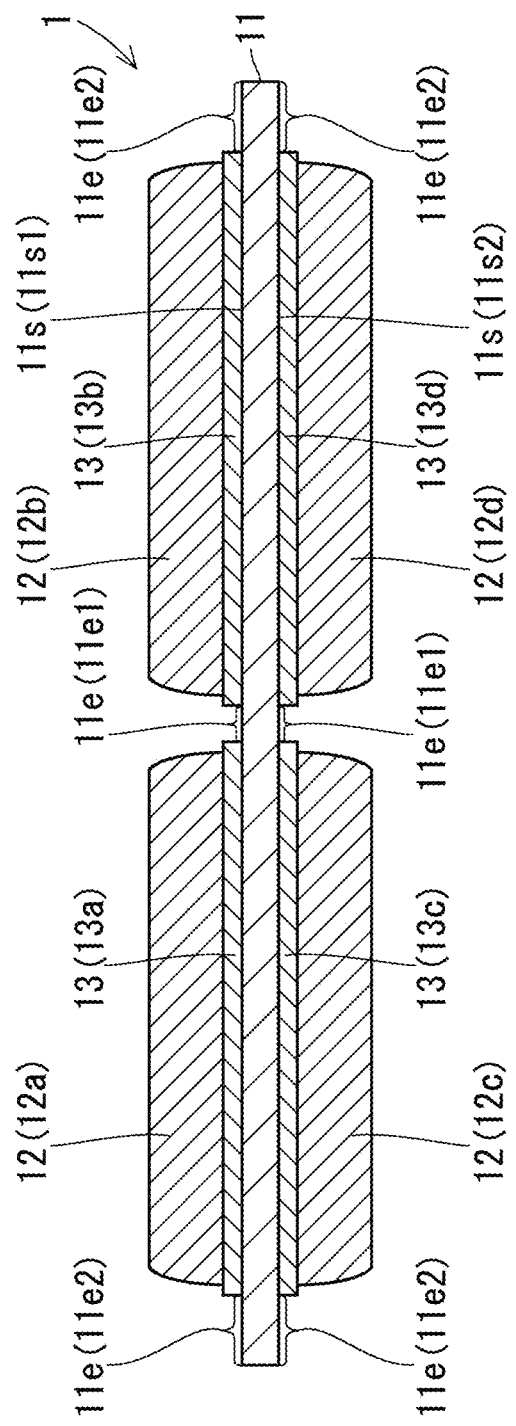
FIG. 1 is a schematic cross-sectional view of a bonded substrate 1.

FIG. 1 is a schematic cross-sectional view of a bonded substrate 1 according to an embodiment.

The bonded substrate 1 shown in FIG. 1 includes a silicon nitride ceramic substrate 11, copper plates 12, and bonding layers 13. The bonded substrate 1 may include components other than these components.

The silicon nitride ceramic substrate 11 is a sintered body of many columnar or plate-like silicon nitride crystalline particles. The copper plates 12 are bonded to the silicon nitride ceramic substrate 11 through the bonding layers 13.

The bonding layers 13 are layers generated from brazing material layers used to bond the copper plates 12 to the silicon nitride ceramic substrate 11. The bonding layers 13 contain active metal contained in the brazing material layers. The active metal is herein at least one type of metal selected from the group consisting of titanium and zirconium. The bonding layers 13, however, contain at least silver as metal other than the active metal, and may further contain at least one type of metal selected from the group consisting of copper, indium, and tin. The bonding layers 13 may contain nitrogen and/or silicon supplied from the silicon nitride ceramic substrate 11 during bonding. In this case, nitrogen and/or silicon as supplied and the active metal may form a compound. The bonding layers 13 may also contain copper supplied from the copper plates 12 during bonding.

The copper plates 12 and the bonding layers 13 are each disposed over at least one of two main surfaces 11s (11s1 and 11s2) of the silicon nitride ceramic substrate 11. FIG. 1 shows a case where the copper plates 12 and the bonding layers 13 are disposed over the respective main surfaces 11s. The bonding layers 13 bond the copper plates 12 to the respective main surfaces 11s of the silicon nitride ceramic substrate 11.

The copper plates 12 are each patterned into a predetermined shape according to a desired wiring pattern. Portions of each of the copper plates 12 forming a part of the wiring pattern are hereinafter also referred to as patterned portions. FIG. 1 shows a case where a first patterned portion 12a and a second patterned portion 12b are disposed over one main surface 11s1 to be separated from each other, and a third patterned portion 12c and a fourth patterned portion 12d are similarly disposed over the other main surface 11s2 to be separated from each other.

The bonding layers 13 are also patterned according to the shape of the copper plates 12. Patterned portions of each of the bonding layers 13 are hereinafter also referred to as patterned bonding portions or simply referred to as bonding portions. In the case shown in FIG. 1, the first patterned portion 12a and the second patterned portion 12b of one of the copper plates 12 are respectively bonded to the main surface 11s1 through a first bonding portion 13a and a second bonding portion 13b, and the third patterned portion 12c and the fourth patterned portion 12d of the other one of the copper plates 12 are respectively bonded to the main surface 11s2 through a third bonding portion 13c and a fourth bonding portion 13d.

A laminate of a patterned portion of each of the copper plates 12 and a bonding portion of each of the bonding layers 13 bonding the patterned portion to the silicon nitride ceramic substrate 11 is hereinafter also referred to as a patterned laminate.

The copper plates 12 and the bonding layers 13 have a configuration as described above, so that a part of the main surface 11s1 is externally exposed as exposed portions 11e in the bonded substrate 1 shown in FIG. 1.

More particularly, the exposed portions 11e include an inter-pattern exposed portion 11e1 and a non-inter-pattern exposed portion 11e2. The former is one type of the exposed portions 11e located between patterned laminates separated from each other on the same main surface 11s1, and the latter is the other type of the exposed portions 11e other than the inter-pattern exposed portion 11e1.

Spacing between patterned laminates is approximately 0.5 mm to 1.5 mm.

The bonded substrate 1 may be used in any way, and is used, for example, as an insulating heat-dissipating substrate on which a power semiconductor device is mounted.

2. Bonding Structure

Figure 2:
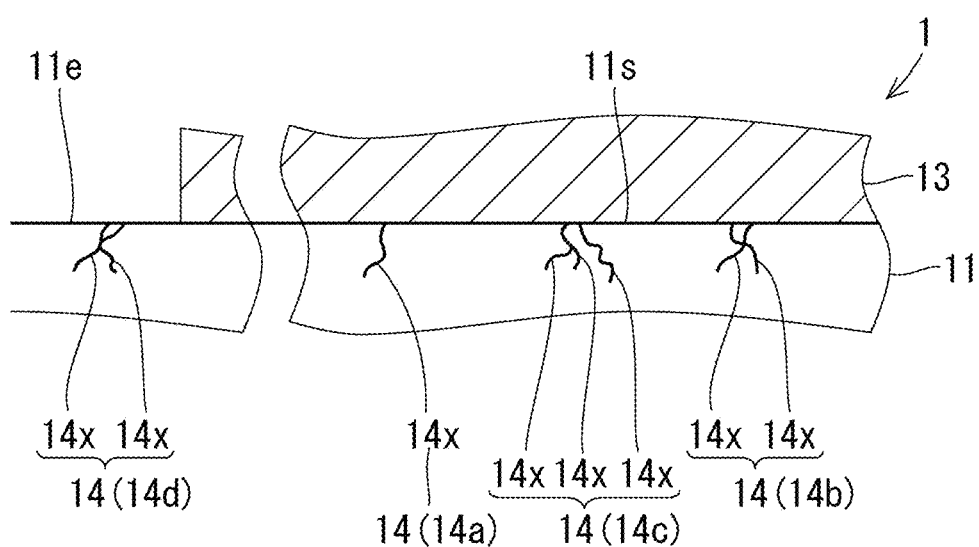
FIG. 2 is a diagram for explaining bonding of a silicon nitride ceramic substrate 11 and a bonding layer 13 of the bonded substrate 1.

FIG. 2 is a diagram for explaining bonding of the silicon nitride ceramic substrate 11 and each of the bonding layers 13 of the bonded substrate 1.

As shown in FIG. 2, the bonded substrate 1 includes a plurality of penetrating regions 14 (14a, 14b, 14c, and 14d). The penetrating regions 14 each include one or more penetrating portions 14x extending inward from the main surface 11s of the silicon nitride ceramic substrate 11.

As shown in FIG. 2, the individual penetrating portions 14x are linear parts extending inward from the main surface 11s of the silicon nitride ceramic substrate 11. Although shown as a line (typically, a polyline or a curve) present only in a plane formed by the sheet of FIG. 2 for the purpose of illustration, the penetrating portions 14x are actually formed linearly while being bent, being curved, and branching randomly in three dimensions, and penetrate into the silicon nitride ceramic substrate 11.

The individual penetrating regions 14 are each a single penetrating portion 14x or a set (group) of a plurality of penetrating portions 14x close to each other. In a case shown in FIG. 2, the penetrating region 14a is constituted by a single penetrating portion 14x. The penetrating region 14b is constituted by two different penetrating portions 14x entangled in three dimensions. Furthermore, the penetrating region 14c is constituted by one branching penetrating portion 14x and another penetrating portion 14x close to the branching penetrating portion 14x. On the other hand, the penetrating region 14d is constituted by two penetrating portions 14x extending from one of the exposed portions 11e in contrast to the other penetrating regions 14 (14a, 14b, and 14c).

Assume that the penetrating portions 14x penetrate straight from a starting point on the main surface 11s, a footprint of each of the penetrating regions 14 at the main surface and a footprint of the penetrating region 14 on an inside are the same. The bonded substrate 1 according to the present embodiment, however, includes the penetrating portions 14x and the penetrating regions 14 in the form described above, so that a footprint of each of the penetrating regions 14 in the silicon nitride ceramic substrate 11 at a plane parallel to the main surface 11s, that is, a projected area of the penetrating region 14 in the silicon nitride ceramic substrate 11 imaginarily projected onto the main surface 11s tends to be greater than the area of the penetrating region 14 actually present at the main surface 11s as the starting point except for a case where an excessively large number of penetrating regions 14 are present. This suggests that a bonding strength of the copper plates 12 to the silicon nitride ceramic substrate 11 of the bonded substrate 1 is suitably secured even in a case where the bonded substrate 1 does not include an excessively large number of penetrating regions 14.

FIG. 3 is a schematic cross-sectional view showing one of the penetrating portions 14x in the silicon nitride ceramic substrate 11 and the vicinity (microstructure) of the penetrating portion 14x in more details. The silicon nitride ceramic substrate 11 is a sintered body of many silicon nitride particles (crystalline particles) 21, and secondary phases 22 each containing an element, such as magnesium and yttrium, derived from a sintering aid used when the silicon nitride ceramic substrate 11 is manufactured, and formed of an oxide, glass, and the like are present between the silicon nitride particles 21. Some of intergranular spaces between the silicon nitride particles 21 form voids 23.

The penetrating portion 14x shown in FIG. 3 penetrates from the main surface 11s of the silicon nitride ceramic substrate 11 at an interface between the silicon nitride ceramic substrate 11 and the bonding layer 13 into the silicon nitride ceramic substrate 11. The penetrating portion 14x penetrates into portions being originally the voids 23.

Although a single continuous penetrating portion 14x is illustrated in FIG. 3, the penetrating portion 14x is bent, is curved, or branches, randomly in three dimensions in actuality as described above, and thus is sometimes apparently non-continuous in any cross-sectional image (e.g., a cross-sectional SEM image) along a thickness direction of the silicon nitride ceramic substrate 11 (a direction perpendicular to the main surface 11s). FIG. 3 shows the single penetrating portion 14x appearing to be divided into at least six portions 14x1 to 14x6 in a cross section along the sheet of FIG. 3 to show such an apparently non-continuous state.

Such appearance that the single penetrating portion 14x is divided into a plurality of portions in any cross section makes it difficult to individually specify the respective penetrating portions 14x in a cross-sectional image of a portion where a plurality of penetrating portions 14x are close to each other. Thus, in the present embodiment, a single penetrating portion 14x and a set of a plurality of penetrating portions 14x close to each other are each handled as a penetrating region 14 without distinguishing therebetween in particular in a cross-sectional image.

More particularly, the penetrating portion 14x shown in FIG. 3 penetrates continuously from a lower end of the bonding layer 13 being in contact with the main surface 11s. The penetrating portion 14x is generated from a brazing material layer used to bond the copper plate 12 to the silicon nitride ceramic substrate 11 as with the bonding layer 13. That is to say, the penetrating portion 14x shown in FIG. 3 is formed by a portion of the brazing material layer penetrating into the silicon nitride ceramic substrate 11 when the bonding layer 13 is formed. The penetrating portion 14x contains, from among metal contained in the brazing material layer, the metal (mainly silver) other than the active metal.

Some of the penetrating portions 14x are not continuous from the bonding layer 13, but penetrate from the exposed portion 11e of the silicon nitride ceramic substrate 11 as the starting point. In the case shown in FIG. 2, the penetrating portions 14x constituting the penetrating region 14d correspond to such penetrating portions 14x. Such penetrating portions 14x, however, originally penetrate continuously from the bonding layer 13, and the exposed portion 11e becomes its starting point through removal of the bonding layer 13 after formation of the penetrating portions 14x. The penetrating portions 14x thus also contain, from among metal contained in the brazing material layer, the metal other than the active metal.

In the bonded substrate 1 including the plurality of penetrating regions 14 each including the one or more penetrating portions 14x penetrating continuously from the bonding layer 13 as shown in FIG. 3, the penetrating portions 14x interfere with separation of the bonding layer 13 from the silicon nitride ceramic substrate 11. An adhesion strength of the bonding layer 13 to the silicon nitride ceramic substrate 11 is thereby increased in the bonded substrate 1. As a result, the bonded substrate 1 according to the present embodiment has high cold durability.

In the bonded substrate 1, at least some of the voids 23 present in the silicon nitride ceramic substrate 11 before bonding are filled with the penetrating portions 14x. That is to say, the number of voids 23 in the silicon nitride ceramic substrate 11 is reduced after bonding compared with that before bonding, so that cracking and other types of breakage starting at the voids 23 are suppressed. The bonded substrate 1 thus has a high flexural strength.

The individual penetrating portions 14x preferably penetrate into the silicon nitride ceramic substrate 11 to a depth of 3 μm or more and 30 μm or less from the main surface 11s, and more preferably penetrate into the silicon nitride ceramic substrate 11 to a depth of 3 μm or more and 20 μm or less. In this case, the bonded substrate 1 having high cold durability and high insulation is achieved. In a case where a depth to which the penetrating portions 14x penetrate is smaller than a lower limit of those ranges, it is difficult to interfere with separation of the bonding layer 13 from the silicon nitride ceramic substrate 11, and it tends to be difficult to secure high cold durability of the bonded substrate 1. In a case where the depth to which the penetrating portions 14x penetrate is greater than upper limits of those ranges, it tends to be difficult to secure high insulation of the bonded substrate 1 due to concentration of an electric field on the penetrating portions 14x.

The number of penetrating regions 14 present per square millimeter of the main surface 11s is preferably approximately one or more and 30 or less, and is more preferably approximately one or more and 10 or less. In a case where the number of penetrating regions 14 is smaller than a lower limit of these ranges, the effect of interfering with separation of the bonding layer 13 from the silicon nitride ceramic substrate 11 cannot sufficiently be obtained, and, as a result, it tends to be difficult to secure high cold durability of the bonded substrate 1.

On the other hand, the number of penetrating regions 14 greater than upper limits of those ranges is not preferable because, when a voltage is applied across patterned portions of the copper plate 12 included in adjacent patterned laminates (e.g., across the first patterned portion 12a and the second patterned portion 12b and across the third pattern 12c and the fourth patterned portion 12d in the case of FIG. 1), migration of metal (typically silver) present in the penetrating regions 14 significantly occurs to reduce insulation resistance between the patterned laminates.

3 Bonded Substrate Manufacturing Method

Figure 5:
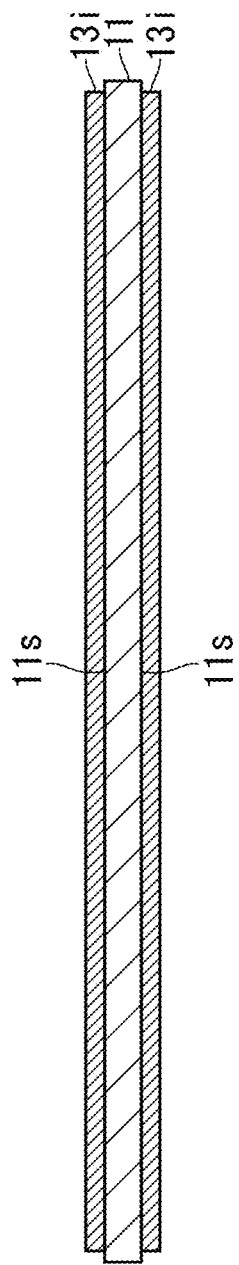
FIG. 5 is a cross-sectional view schematically showing an intermediate product obtained in the process of manufacturing the bonded substrate 1.
Figure 6:
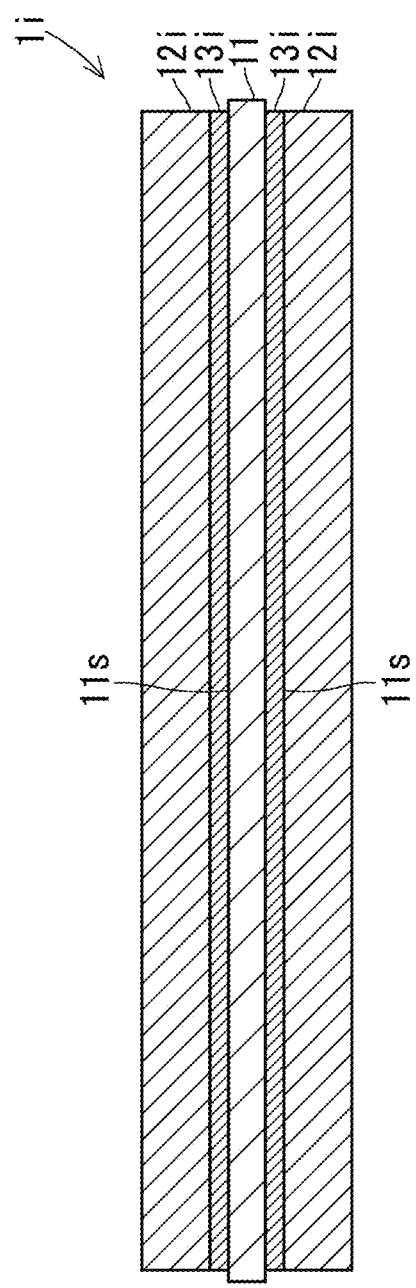
FIG. 6 is a cross-sectional view schematically showing an intermediate product obtained in the process of manufacturing the bonded substrate 1.
Figure 7:
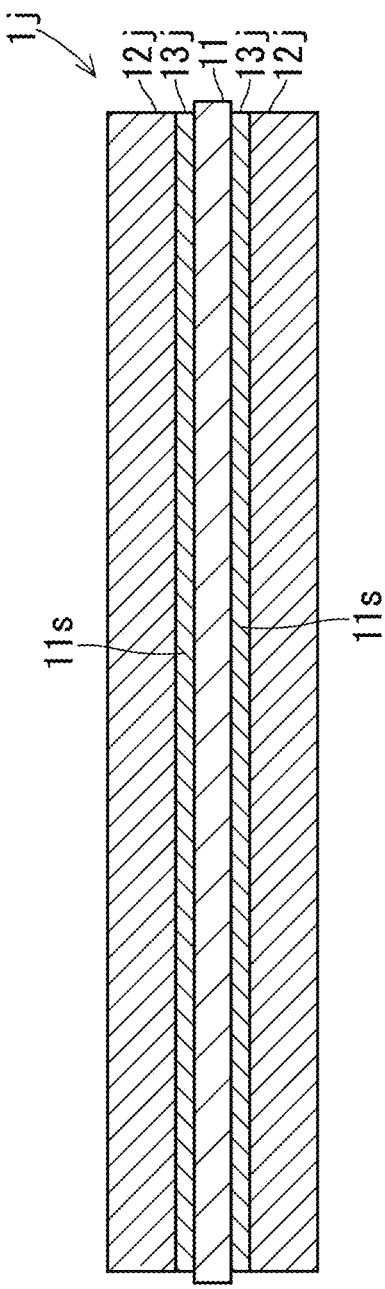
FIG. 7 is a cross-sectional view schematically showing an intermediate product obtained in the process of manufacturing the bonded substrate 1.

FIG. 4 is a flowchart showing a sequence in manufacturing the bonded substrate 1. FIGS. 5, 6, and 7 are cross-sectional views schematically showing intermediate products obtained in the process of manufacturing the bonded substrate 1.

In the manufacture of the bonded substrate 1, steps S101 to S105 shown in FIG. 4 are sequentially performed.

In step S101, the silicon nitride ceramic substrate 11 is prepared. The prepared silicon nitride ceramic substrate 11 is the sintered body of the many silicon nitride particles (crystalline particles) 21, has the main surfaces 11s, and has the secondary phases 22 and the voids 23 between the silicon nitride particles 21 as described above.

In step S102, brazing material layers 13i are formed on the main surfaces 11s of the silicon nitride ceramic substrate 11 as shown in FIG. 5.

When the brazing material layers 13i are formed, a paste (brazing material paste) containing an active metal brazing material, a binder, and a solvent is prepared. The brazing material paste may further contain a dispersant, an antifoaming agent, and the like. The prepared brazing material paste is then screen printed on the main surfaces 11s of the silicon nitride ceramic substrate 11 to form screen printed films of the brazing material paste on the main surfaces 11s of the silicon nitride ceramic substrate 11. The solvent contained in the formed screen printed films is then volatilized. The screen printed films are thereby changed into the brazing material layers 13i containing the active metal brazing material and the binder. The brazing material layers 13i may be formed by a method different from this method.

The active metal brazing material contains a powder of active metal hydride and a powder of metal other than active metal. The powder of active metal hydride contains a hydride of at least one type of active metal selected from the group consisting of titanium and zirconium. The powder of metal other than active metal contains at least silver, and may further contain at least one type of metal selected from the group consisting of copper, indium, and tin. In a case where the active metal brazing material contains at least one type of metal selected from the group consisting of copper, indium, and tin in addition to silver, the active metal brazing material has a lower melting point than silver.

The active metal brazing material preferably contains 40 wt % or more and 80 wt % or less silver.

The active metal brazing material is preferably formed of a powder having an average particle size of 0.1 μm or more and 10 μm or less. The average particle size can be obtained by measuring particle size distribution using a commercially available laser diffraction particle size distribution analyzer, and calculating D50 (a median diameter) from the measured particle size distribution. In a case where the active metal brazing material is formed of the powder having such a small average particle size, the brazing material layers 13i can each be formed to have a small thickness.

The brazing material layers 13i each preferably have a thickness of 0.1 μm or more and 10 μm or less, and more preferably have a thickness of 0.1 μm or more and 5 μm or less.

In step S103, copper plates 12i are disposed on the formed brazing material layers 13i as shown in FIG. 6. An intermediate product 1i including the silicon nitride ceramic substrate 11, the copper plates 12i, and the brazing material layers 13i is thereby obtained.

In step S104, the obtained intermediate product 1i is heat treated. Portions of the brazing material layers 13i move to the voids 23 of the silicon nitride ceramic substrate 11 through heat treatment. The plurality of penetrating portions 14x containing the metal (mainly silver) other than the active metal contained in the brazing material layers 13i are thereby formed. That is to say, the brazing material layers 13i are changed into bonding layers 13j containing the active metal shown in FIG. 7 and the plurality of penetrating portions 14x penetrating continuously from the bonding layers 13j and containing the metal other than the active metal.

An intermediate product 1j including the silicon nitride ceramic substrate 11, copper plates 12j, and the bonding layers 13j is obtained through heat treatment. The bonding layers 13j bond the copper plates 12j to the main surfaces 11s of the silicon nitride ceramic substrate 11. The plurality of penetrating regions 14 are formed in the silicon nitride ceramic substrate 11, and the one or more penetrating portions 14x of each of the penetrating regions 14 penetrate continuously from the bonding layers 13j into the voids 23 of the silicon nitride ceramic substrate 11.

Heat treatment is preferably performed by heating the intermediate product 1i in accordance with a temperature profile having a maximum temperature of 800° C. or more and 860° C. or less. The plurality of penetrating portions 14x penetrating into the silicon nitride ceramic substrate 11 to a depth of 3 μm or more and 20 μm or less from the main surface 11s are thereby formed.

In a case where the maximum temperature is less than 800° C., however, the depth to which the penetrating portions 14x penetrate tends to be smaller than 3 μm. In this case, it is difficult to interfere with separation of the bonding layer 13 from the silicon nitride ceramic substrate 11 in the bonded substrate 1 eventually obtained, and, as a result, it tends to be difficult to secure high cold durability of the bonded substrate 1.

In a case where the maximum temperature is more than 860° C., the depth to which the penetrating portions 14x penetrate tends to be greater than 20 μm. In this case, partial discharge starting at the penetrating portions 14x tends to occur, and, as a result, it tends to be difficult to secure high insulation of the bonded substrate 1.

Heat treatment of the intermediate product 1i is preferably hot pressing. Hot pressing of the intermediate product 1i is preferably performed by pressurizing the silicon nitride ceramic substrate 11 along a thickness direction thereof (pressurizing the copper plates 12i) in accordance with a contact pressure profile having a maximum contact pressure PMAX of 5 MPa or more and 30 MPa or less while heating the intermediate product 1i in a vacuum or an inert gas in accordance with a temperature profile having a maximum temperature TMAX of 800° C. or more and 900° C. or less. In this case, the copper plates 12i can be bonded to the silicon nitride ceramic substrate 11 through the bonding layers 13j without forming any voids in the bonding layers 13j even in a case where the brazing material layers 13i each have a small thickness of 0.1 μm or more and 10 μm or less.

FIG. 8 shows an example of the temperature profile and the contact pressure profile when hot pressing is performed in the process of manufacturing the bonded substrate 1.

In a case where hot pressing is performed in accordance with the temperature profile and the contact pressure profile shown in FIG. 8, the temperature of the intermediate product 1$i$ is first raised from a room temperature to a debinding temperature TB. The temperature of the intermediate product 1$i$ is then maintained at the debinding temperature TB over a set period of time. Debinding of the brazing material layers 13$i$ is thereby completed. The temperature of the intermediate product 1$i$ is then raised from the debinding temperature TB to the maximum temperature TMAX, and is maintained at the maximum temperature TMAX over a set period of time. The temperature of the intermediate product 1$i$ is finally lowered from the maximum temperature TMAX to the room temperature.

In this process, until the temperature of the intermediate product 1$i$ reaches the debinding temperature TB and debinding is completed, only pressurization of the intermediate product 1$i$ under low pressure for stopping movement is performed on the copper plates 12$i$, and pressurization for bonding is not performed.

Pressurization for stopping movement is performed by pressurizing the copper plates 12$i$ under contact pressure (movement stopping contact pressure) being lower than contact pressure under which pressurization for bonding is performed, but enabling suppression of movement of the intermediate product 1$i$, for example, under a low contact pressure of approximately 0.1 MPa to 0.3 MPa. The movement stopping contact pressure is lower than contact pressure applied to the intermediate product 1$i$ when pressurization for bonding is performed. Thus, even when pressurization for stopping movement is performed in the process of debinding, interference with debinding is suitably suppressed, and carbon residues in the bonding layers 13 of the bonded substrate 1 eventually obtained are also suppressed.

In the process that the temperature of the intermediate product 1$i$ is raised from the debinding temperature TB to the maximum temperature TMAX upon completion of debinding, pressurization of the intermediate product 1$i$ for bonding is performed on the copper plates 12$i$, and contact pressure applied to the copper plates 12$i$ is increased to the maximum contact pressure PMAX. In other words, pressurization for bonding performed on the copper plates 12$i$ starts after the temperature of the copper plates 12$i$ is raised to make the copper plates 12$i$ more likely to be plastically deformed, and contact pressure applied to the copper plates 12$i$ is then increased to the maximum contact pressure PMAX.

In the example shown in FIG. 8, the copper plates 12$i$ trying to thermally expand with raising temperature are constrained by strong pressurization for bonding only after completion of debinding. The constraint on the copper plates 12$i$ is thus suppressive, and thus retention of stress in the copper plates 12$i$ after the bonded substrate 1 is manufactured is suppressed. As a result, deformation, breakage, and the like of the bonded substrate 1 due to retention of stress in the copper plates 12 are suppressed. For example, undulation, cracking, and the like of the bonded substrate 1 are suppressed.

In the example shown in FIG. 8, contact pressure applied to the intermediate product 1$i$ for bonding is increased from the movement stopping contact pressure to the maximum contact pressure PMAX in two stages. More particularly, at a time when maintenance at the debinding temperature TB is completed, and the temperature of the intermediate product 1$i$ starts to be raised again, contact pressure applied to the intermediate product 1$i$ (specifically, the copper plates 12$i$) is increased first from the movement stopping contact pressure to first contact pressure P1, and is then maintained at the first contact pressure P1 over a set period of time.

Upon completion of maintenance at the first contact pressure P1, contact pressure applied to the intermediate product 1$i$ is increased from the first contact pressure P1 to second contact pressure (the maximum contact pressure) PMAX higher than the first contact pressure P1, and is maintained at the second contact pressure PMAX over a set period of time. The increase in contact pressure is performed in the process of raising the temperature of the intermediate product 1$i$ from the debinding temperature TB to the maximum temperature TMAX. In other words, the increase in contact pressure is performed after the temperature of the copper plates 12$i$ is raised to make the copper plates 12$i$ more likely to be plastically deformed. The first contact pressure P1 applied before the increase in contact pressure is relatively low, so that cracking of the silicon nitride ceramic substrate 11 is suppressed even when the first contact pressure P1 is applied before the copper plates 12$i$ become more likely to be plastically deformed.

More particularly, the first contact pressure P1 is set to a value at which, after the start of pressurization for bonding performed on the intermediate product 1$i$, the copper plates 12$i$ are planarized, and regions of the copper plates 12$i$ not having been in contact with the brazing material layers 13$i$ come into contact with the brazing material layers 13$i$, and is preferably set to 1.0 MPa or more. An effect obtained by using the example significantly appears in a case where the active metal brazing material contains silver and does not contain copper. This is because, in this case, copper is diffused from the copper plates 12$i$ to titanium particles contained in the brazing material layers 13$i$ when the intermediate product 1$i$ is hot pressed, and thus a compound of titanium and copper is generated in the brazing material layers 13$i$ to suppress generation of a compound of silver and titanium interfering with bonding.

Pressurization for bonding performed on the intermediate product 1$i$ preferably starts while the temperature of the intermediate product 1$i$ is 500° C. or more and 700° C. or less. This is because the debinding temperature TB is approximately 500° C., and the temperature at which the compound of titanium and copper starts to be generated is approximately 700° C.

The first contact pressure P1 is preferably 5 MPa or less. In a case where the first contact pressure P1 is more than 5 MPa, the copper plates 12$i$ are pressed hard against the silicon nitride ceramic substrate 11, and the silicon nitride ceramic substrate 11 tends to be cracked. The second contact pressure PMAX is preferably 5 MPa or more and 30 MPa or less. In a case where the second contact pressure PMAX is less than 5 MPa, bonding of the copper plates 12$i$ to the silicon nitride ceramic substrate 11 tends to be reduced. In a case where the second contact pressure PMAX is more than 30 MPa, the copper plates 12$i$ are pressed hard against the silicon nitride ceramic substrate 11, and the silicon nitride ceramic substrate 11 tends to be cracked.

During heat treatment of the intermediate product 1$i$, all or some of metal components, such as silver, contained in the brazing material layers 13$i$ may be diffused into the silicon nitride ceramic substrate 11 and/or the copper plates 12$i$. Nitrogen and/or silicon contained in the silicon nitride ceramic substrate 11 may be diffused into the brazing material layers 13$i$. Furthermore, copper contained in the copper plates 12$i$ may be diffused into the brazing material layers 13$i$.

In step S105, the copper plates 12*j* and the bonding layers 13*j* are patterned by etching and the like. The copper plates 12*j* are thereby changed into the copper plates 12 patterned as shown in FIG. 1. The bonding layers 13*j* are also changed into the bonding layers 13 patterned as shown in FIG. 1.

4 Influence of Maximum Temperature During Heat Treatment

Seven types of bonded substrates 1 were manufactured by the above-mentioned manufacturing method. Specifically, the bonded substrates 1 were manufactured under seven conditions (Conditions 1 to 7) differing in maximum temperature of the temperature profile for hot pressing performed as heat treatment.

Titanium was used as the active metal contained in the active metal brazing material. Silver was used as the metal other than the active metal contained in the active metal brazing material.

The above-mentioned hot pressing was performed when intermediate products 1*i* were heat treated. The intermediate products 1*i* were heated in accordance with seven temperature profiles having respective maximum temperatures shown in Table 1 while the intermediate products 1*i* (specifically, the copper plates 12*i*) were pressurized along the thickness direction of the silicon nitride ceramic substrate 11 in accordance with a contact pressure profile having a maximum contact pressure of 20 MPa.

A cross section of each of the manufactured bonded substrates 1 was observed with a scanning electron microscope (SEM) to obtain an SEM image, and an average value of the depth to which the penetrating regions 14 penetrated from the main surface 11*s* was obtained from the obtained SEM image.

An adhesion strength of the copper plates 12 to the silicon nitride ceramic substrate 11 and insulation of each of the manufactured bonded substrates 1 were evaluated. The adhesion strength was evaluated by conducting a peel test of the copper plates 12 on the bonded substrate 1, and measuring a peel strength of the copper plates 12 of the bonded substrate 1. Insulation was evaluated by conducting a withstand voltage test on the bonded substrate 1, and recording a dielectric breakdown voltage at which electrical breakdown of the bonded substrate 1 occurred. A voltage rise rate in the withstand voltage test was 0.1 kV/s.

The maximum temperature of the temperature profile under each of Conditions 1 to 7, the depth to which the penetrating regions 14 penetrate, and results of the peel test and the withstand voltage test are shown in Table 1 as a list.

Figure 9A:
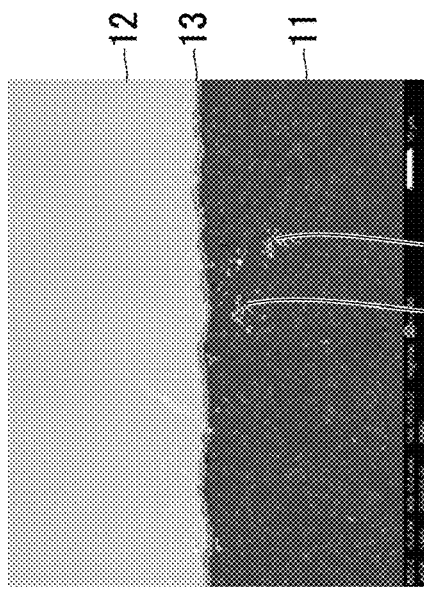
FIGS. 9A to 9E show cross-sectional scanning electron microscope (SEM) images of bonded substrates 1.
Figure 9B:
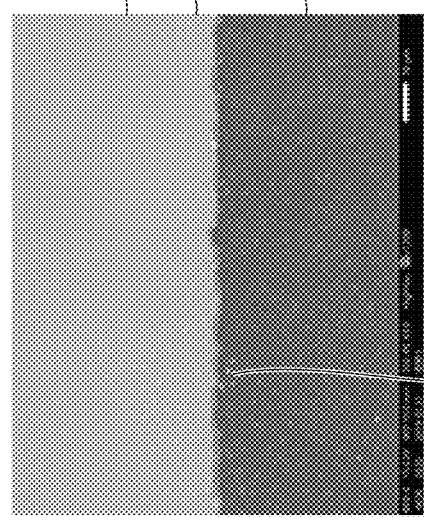
Figure 9C:
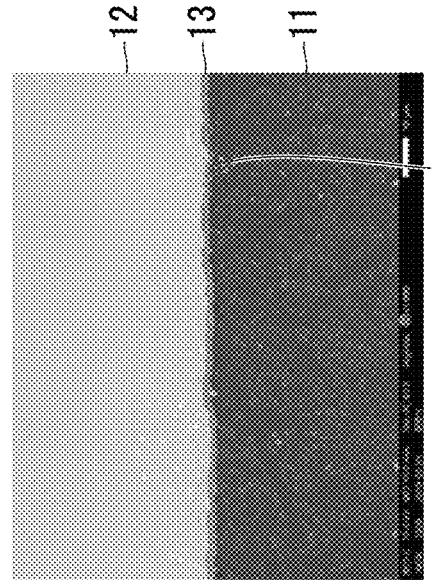
Figure 9D:
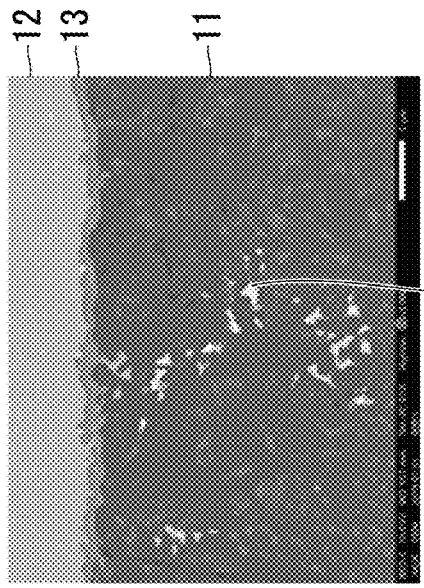
Figure 9E:
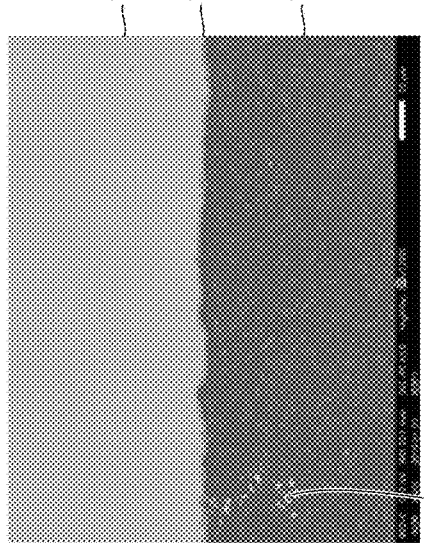

FIGS. 9A to 9E show cross-sectional SEM images of bonded substrates 1 manufactured under different conditions. FIGS. 9A to 9D are SEM images of the bonded substrates 1 manufactured under Conditions 2 to 5, and FIG. 9E is a magnified image of FIG. 9D.

TABLE 1

| CONDITION | MAXIMUM TEMPER- ATURE (° C.) | AVERAGE VALUE OF PENE- TRATION DEPTH (µm) | PEEL STRENGTH (kN/m) | DI- ELECTRIC BREAK- DOWN VOLTAGE (kV) |
|---|---|---|---|---|
| CONDITION 1 | 780 | 1 | 17 | 10 |
| CONDITION 2 | 800 | 3 | 25 | 9.7 |
| CONDITION 3 | 815 | 7 | 30 | 9.3 |
| CONDITION 4 | 830 | 12 | 32 | 9.0 |

TABLE 1-continued

| CONDITION | MAXIMUM TEMPER- ATURE (° C.) | AVERAGE VALUE OF PENE- TRATION DEPTH (µm) | PEEL STRENGTH (kN/m) | DI- ELECTRIC BREAK- DOWN VOLTAGE (kV) |
|---|---|---|---|---|
| CONDITION 5 | 850 | 18 | 39 | 8.9 |
| CONDITION 6 | 860 | 20 | 38 | 8.6 |
| CONDITION 7 | 880 | 25 | 37 | 7.2 |

As shown in Table 1, as for the bonded substrate 1 manufactured under Condition 1 under which the temperature profile had a maximum temperature of less than 800° C., the average value of the depth to which the penetrating regions 14 penetrate was 1 µm, the peel strength was 17 kN/m, and the dielectric breakdown voltage was 10 kV.

As for each of the bonded substrates 1 manufactured under Conditions 2 to 6 under which the temperature profile had a maximum temperature of 800° C. or more and 860° C. or less, the average value of the depth to which the penetrating regions 14 penetrate was 3 µm to 20 µm, the peel strength of the bonded substrate 1 was 25 kN/m to 39 kN/m, and the dielectric breakdown voltage of the bonded substrate 1 was 8.6 kV to 9.7 kV.

That is to say, the dielectric breakdown voltage was slightly lower than that of the bonded substrate 1 manufactured under Condition 1, but the peel strength was significantly higher than that of the bonded substrate 1 manufactured under Condition 1.

An image of the penetrating portion 14*x* shown in each of FIGS. 9D and 9E is a typical example in a case where the projected area of the penetrating region 14 in the silicon nitride ceramic substrate 11 imaginarily projected onto the main surface 11*s* is greater than the area of the penetrating region 14 actually present at the main surface 11*s* as the starting point.

As for the bonded substrate 1 manufactured under Condition 7 under which the temperature profile had a maximum temperature of more than 860° C., the average value of the depth to which the penetrating regions 14 penetrate was 25 µm, the peel strength of the bonded substrate 1 was 37 kN/m, and the dielectric breakdown voltage of the bonded substrate 1 was 7.2 kV.

That is to say, the peel strength was substantially the same as that of each of the bonded substrates 1 manufactured under Conditions 2 to 6, but the dielectric breakdown voltage was much lower than that of the bonded substrate 1 manufactured under Condition 1.

It is understood from these results that, when the temperature profile has a maximum temperature of 800° C. or more and 860° C. or less, the plurality of penetrating regions 14 penetrating into the silicon nitride ceramic substrate 11 to the depth of 3 µm or more and 20 µm or less can be formed, and, as a result, the bonded substrate 1 having a good balance between a high adhesion strength and high insulation can be obtained.

FIGS. 10A to 10I show an SEM image of the bonded substrate 1 manufactured under Condition 5 and elemental mapping images in an imaging field of view of the SEM image. FIG. 10A is the SEM image shown in FIG. 9E, and FIGS. 10B, 10C, 10D, 10E, 10F, 10G, 10H, and 10I are respectively elemental mapping images of magnesium (Mg), titanium (Ti), yttrium (Y), silver (Ag), boron (B), nitrogen (N), silicon (Si), and copper (Cu). It is understood from these elemental mapping images that the penetrating portion 14x is formed mainly of silver.

5 Migration Evaluation

In order to evaluate a relationship between the extent of distribution of the penetrating regions 14 in the bonded substrate 1 and migration of silver, six types of bonded substrates 1 differing in number of penetrating regions 14 per unit area were prepared, and a migration test between adjacent patterned laminates was conducted on each of the bonded substrates 1. The peel test and the withstand voltage test were also conducted same as in a case where the values shown in Table 1 were obtained.

The bonded substrates 1 were manufactured by preparing many silicon nitride ceramic substrates 11 stratified into a plurality of levels according to a state of distribution of the voids 23 (the number of voids 23 per unit area), bonding the copper plates 12i to each of the silicon nitride ceramic substrates 11 by using hot pressing as heat treatment, and further performing patterning by etching. In this case, different temperature profiles and different contact pressure profiles were used to vary the number of penetrating regions 14 per unit area and (an average value of) the depth to which the penetrating regions 14 penetrate.

The obtained bonded substrates were stratified and selected based on the state of distribution of the penetrating regions 14 (the number of penetrating regions 14 per unit area) and (the average value of) the depth to which the penetrating regions 14 penetrate.

Specifically, the bonded substrates 1 were stratified into six levels of the number of penetrating regions (a discrete value integer-valued by rounding off) present per square millimeter of the exposed portion 11e of the silicon nitride ceramic substrate 11 of each of the bonded substrates 1 of 0, 1, 2 to 3, 4 to 10, 11 to 30, and 31 to 50. In this case, only bonded substrates 1 in each of which (the average value of) the penetration depth was 5 μm to 10 μm were selected. A maximum value of the number of penetrating regions at each of the levels is hereinafter handled as a representative value at the level, and a range of discrete values is identified by (referred to as) the representative value for convenience sake. The number of penetrating regions present per square millimeter may exceed 50 in some of the bonded substrates 1 in actuality, but no such bonded substrates 1 were observed when the above-mentioned stratification was performed, so that an upper limit of the number of penetrating regions was set to 50 when the above-mentioned levels are set. The migration test was conducted by disposing each of the bonded substrates 1 under a high-temperature high-humidity atmosphere at a temperature of 85° C. and a humidity of 85%, and continuously applying a DC voltage of 1.5 kV/mm across patterned portions of the copper plate 12 belonging to adjacent patterned laminates for 1000 hours. In this case, insulation resistance between the portions was continuously measured. In a case where a measured value is continuously reduced from an initial value by one or more orders of magnitude during measurement of insulation resistance, it is determined that problematic significant reduction in insulation resistance is occurring. As for a bonded substrate 1 in which significant reduction in insulation resistance occurred when the DC voltage was applied for 500 hours to 1000 hours, drying was performed at 100° C., and then insulation resistance was measured again.

FIG. 11 is a graph showing temporal changes of insulation resistance of some of the bonded substrates 1 when the migration test was conducted. Specifically, the graph shows temporal changes of insulation resistance of two bonded substrates 1 in each of which the representative value of the number of penetrating regions 14 per square millimeter is one, two bonded substrates 1 in each of which the representative value of the number of penetrating regions 14 per square millimeter is 10, and one bonded substrate 1 in which the representative value of the number of penetrating regions 14 per square millimeter is 50.

It can be seen from FIG. 11 that insulation resistance at the start of the test is almost maintained as for the bonded substrates 1 in each of which the representative value of the number of penetrating regions 14 per square millimeter is one or 10, whereas insulation resistance is greatly reduced by approximately four orders of magnitude during the test as for the bonded substrate 1 in which the representative value of the number of penetrating regions 14 per square millimeter is 50. It is considered that insulation resistance was greatly reduced as a result of migration in the letter case.

The number of penetrating regions 14 per square millimeter (the range of discrete values and the representative value) and a result of migration evaluation of each of the stratified bonded substrates 1 are shown in Table 2 as a list. In migration evaluation, bonded substrates 1 in each of which problematic significant reduction in insulation resistance did not occur when the DC voltage of 1.5 kV/mm was continuously applied for 1000 hours were evaluated as "excellent" bonded substrates 1, and a circle is marked for each of the bonded substrates 1 in a "MIGRATION EVALUATION" column in Table 2. A bonded substrate 1 in which insulation resistance was significantly reduced when the time to continuously apply the DC voltage elapsed 500 hours to 1000 hours, but reduction in insulation resistance from the initial value measured again after drying at 100° C. was one order of magnitude or less was evaluated as a "suitable" bonded substrate 1, and a triangle is marked for the bonded substrate 1 in the "MIGRATION EVALUATION" column in Table 2. On the other hand, a bonded substrate 1 in which insulation resistance was significantly reduced before the time to continuously apply the DC voltage reached 500 hours or insulation resistance was significantly reduced when the time to continuously apply the DC voltage elapsed 500 hours to 1000 hours, and reduction in insulation resistance from the initial value measured again after drying at 100° C. was one or more orders of magnitude was evaluated as an "unsuitable" bonded substrate 1, and a cross is marked for the bonded substrate 1 in the "MIGRATION EVALUATION" column in Table 2.

TABLE 2

| NUMBER OF PENETRATING REGIONS PER SQUARE MILLIMETER (DISCRETE VALUES) | REPRESENTATIVE VALUE (MAXIMUM VALUE) | MIGRATION EVALUATION |
| --- | --- | --- |
| 0 | 0 | ○ |
| 1 | 1 | ○ |
| 2-3 | 3 | ○ |
| 4-10 | 10 | ○ |
| 11-30 | 30 | Δ |
| 31-50 | 50 | x |

As shown in Table 2, bonded substrates 1 in each of which the number of penetrating regions 14 was zero were evaluated to be excellent in migration evaluation. As for the bonded substrates 1, however, an adhesion strength of the bonding layers 13 to the silicon nitride ceramic substrate 11 evaluated by the peel test was poor.

Bonded substrates 1 in each of which the number of penetrating regions 14 was one or more and 10 or less were also evaluated to be excellent in migration evaluation. Furthermore, as with the bonded substrates 1 shown in Table 1, a good balance between a high adhesion strength and high insulation was achieved.

In contrast, as for bonded substrates 1 in each of which the number of penetrating regions 14 was 11 or more and 30 or less, a high adhesion strength was obtained, but migration evaluation was slightly low, and insulation was not so high.

As for bonded substrates 1 in each of which the number of penetrating regions 14 was 31 or more and 50 or less, a high adhesion strength was observed, but migration accompanied by a significant change in insulation resistance was observed. Migration evaluation was thus low.

Results similar to the above-mentioned results were obtained when (the average value of) the penetration depth was decreased (changed to approximately 3 μm) and increased (changed to approximately 20 μm). The results indicate that, as for the bonded substrates 1 each manufactured so that the representative value of the number of penetrating regions 14 per square millimeter is one or more and 30 or less, and is preferably one or more and 10 or less, and the penetration depth is 3 μm or more and 20 μm or less, a good balance between a high adhesion strength and high insulation is achieved, and reduction in insulation resistance due to migration of silver from the penetrating regions does not occur.

What is claimed is:

1. A bonded substrate comprising:
   a silicon nitride ceramic substrate;
   a copper plate disposed over a main surface of the silicon nitride ceramic substrate, and patterned into a predetermined shape;
   a bonding layer disposed on the main surface according to the shape into which the copper plate is patterned, and bonding the copper plate to the main surface; and
   a plurality of penetrating regions each including one or more penetrating portions penetrating continuously from the main surface into the silicon nitride ceramic substrate to a depth of 3 μm or more and 20 μm or less, wherein
   the penetrating regions contain silver, and the number of penetrating regions present per square millimeter of the main surface is one or more and 30 or less.

2. The bonded substrate according to claim 1, wherein
   in a portion in which the main surface is not exposed, the one or more penetrating portions penetrate continuously from the bonding layer.

3. The bonded substrate according to claim 2, wherein
   the bonding layer contains at least one type of active metal selected from the group consisting of titanium and zirconium, and
   the penetrating portions further contain at least one type of metal selected from the group consisting of copper, indium, and tin.

4. The bonded substrate according to claim 3, wherein
   a projected area of the penetrating regions in the silicon nitride ceramic substrate imaginarily projected onto the main surface is greater than an area of the penetrating regions actually present at the main surface.

5. The bonded substrate according to claim 2, wherein
   a projected area of the penetrating regions in the silicon nitride ceramic substrate imaginarily projected onto the main surface is greater than an area of the penetrating regions actually present at the main surface.

6. The bonded substrate according to claim 2, wherein
   spacing between laminates of patterned portions of the copper plate and patterned portions of the bonding layer is 0.5 mm to 1.5 mm.

7. The bonded substrate according to claim 1, wherein
   the bonding layer contains at least one type of active metal selected from the group consisting of titanium and zirconium, and
   the penetrating portions further contain at least one type of metal selected from the group consisting of copper, indium, and tin.

8. The bonded substrate according to claim 7, wherein
   a projected area of the penetrating regions in the silicon nitride ceramic substrate imaginarily projected onto the main surface is greater than an area of the penetrating regions actually present at the main surface.

9. The bonded substrate according to claim 7, wherein
   spacing between laminates of patterned portions of the copper plate and patterned portions of the bonding layer is 0.5 mm to 1.5 mm.

10. The bonded substrate according to claim 1, wherein
    a projected area of the penetrating regions in the silicon nitride ceramic substrate imaginarily projected onto the main surface is greater than an area of the penetrating regions actually present at the main surface.

11. The bonded substrate according to claim 10, wherein
    spacing between laminates of patterned portions of the copper plate and patterned portions of the bonding layer is 0.5 mm to 1.5 mm.

12. The bonded substrate according to claim 1, wherein
    spacing between laminates of patterned portions of the copper plate and patterned portions of the bonding layer is 0.5 mm to 1.5 mm.

13. A bonded substrate manufacturing method comprising:
    a) preparing a silicon nitride ceramic substrate;
    b) forming a brazing material layer on a main surface of the silicon nitride ceramic substrate;
    c) disposing a copper plate on the brazing material layer to obtain an intermediate product including the silicon nitride ceramic substrate, the brazing material layer, and the copper plate;
    d) heat treating the intermediate product to generate a bonding layer bonding the copper plate to the main surface, and a plurality of penetrating regions each including one or more penetrating portions penetrating continuously from the bonding layer into the silicon nitride ceramic substrate to a depth of 3 μm or more and 20 μm or less from the main surface and containing silver; and
    e) patterning the copper plate and the bonding layer into a predetermined shape, wherein
    in step d), the penetrating regions are formed so that the number of penetrating regions present per square millimeter of the main surface is one or more and 30 or less.

14. The bonded substrate manufacturing method according to claim 13, wherein
    the heat treatment is performed by heating the intermediate product in accordance with a temperature profile having a maximum temperature of 800° C. or more and 860° C. or less.

15. The bonded substrate manufacturing method according to claim 14, wherein
    the brazing material layer contains a hydride of at least one type of active metal selected from the group consisting of titanium and zirconium, silver, and at least one type of metal selected from the group consisting of copper, indium, and tin, and in step d), the penetrating regions are formed by moving metal including at least silver to a void of the silicon nitride ceramic substrate through the heat treatment.

16. The bonded substrate manufacturing method according to claim 15, wherein the heat treatment is performed by pressurizing the intermediate product in accordance with a contact pressure profile having a maximum contact pressure of 5 MPa or more and 30 MPa or less.

17. The bonded substrate manufacturing method according to claim 14, wherein the heat treatment is performed by pressurizing the intermediate product in accordance with a contact pressure profile having a maximum contact pressure of 5 MPa or more and 30 MPa or less.

18. The bonded substrate manufacturing method according to claim 13, wherein the brazing material layer contains a hydride of at least one type of active metal selected from the group consisting of titanium and zirconium, silver, and at least one type of metal selected from the group consisting of copper, indium, and tin, and in step d), the penetrating regions are formed by moving metal including at least silver to a void of the silicon nitride ceramic substrate through the heat treatment.

19. The bonded substrate manufacturing method according to claim 18, wherein the heat treatment is performed by pressurizing the intermediate product in accordance with a contact pressure profile having a maximum contact pressure of 5 MPa or more and 30 MPa or less.

20. The bonded substrate manufacturing method according to claim 13, wherein the heat treatment is performed by pressurizing the intermediate product in accordance with a contact pressure profile having a maximum contact pressure of 5 MPa or more and 30 MPa or less.

* * * * *